United States Patent
Nakagawa et al.

(10) Patent No.: US 6,283,695 B1
(45) Date of Patent: Sep. 4, 2001

(54) TRAY CONVEYING APPARATUS AND METHOD

(75) Inventors: Takeyuki Nakagawa, Tachikawa; Yasuo Chiyo, Musashimurayama, both of (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 09/420,871

(22) Filed: Oct. 19, 1999

(30) Foreign Application Priority Data

Oct. 19, 1998 (JP) .................................................. 10-296272

(51) Int. Cl.$^7$ .................................................. B65G 47/06
(52) U.S. Cl. .......................... 414/416; 414/811; 414/935; 198/346.1; 198/347.3; 209/573
(58) Field of Search ..................................... 209/922, 571, 209/573; 414/403, 416, 795.3, 935, 940, 222.01, 225.01, 798.1, 799, 810, 811; 198/339.1, 346.1, 346.2, 347.1, 347.2, 347.3, 418.6, 431, 463.3, 470.1, 474.1, 476.1

(56) References Cited

U.S. PATENT DOCUMENTS 5,313,156 * 5/1994 Klug et al. ........................ 414/416 X
5,772,040 * 6/1998 Tomiyama et al. ............... 209/922 X
5,906,472 * 5/1999 Nakamura ..................... 414/795.3 X
6,078,188 * 6/2000 Bannai et al. .................... 414/935 X
6,129,496 * 10/2000 Iwasaki et al. ................... 414/940 X

* cited by examiner

Primary Examiner—Robert P. Olszewski
Assistant Examiner—Gerald J. O'Connor
(74) Attorney, Agent, or Firm—Koda & Androlia

(57) ABSTRACT

In a tray conveying apparatus and method for, for instance, semiconductor parts, a main station and substation which have a tray conveying function are driven slidably in a direction perpendicular to a tray conveying line by a station sliding mechanism. When the preparation of a satisfactory-parts tray is required, the sub-station is positioned on the conveying line, and a satisfactory-parts tray is prepared on this sub-station by means of the exchange of parts, etc. Afterward, both main station and sub-station are caused to slide so that the main station is positioned on the conveying line. In this state, the satisfactory-parts tray is positioned in the vicinity of the conveying line, and a tray on the main station is replenished with satisfactory parts from the satisfactory-parts tray. A table sliding mechanism is further provided that has an upper-stage table, which carries a defective-parts tray, and a lower table, which caries a reclaimable-parts tray.

10 Claims, 14 Drawing Sheets

FIG. 7(a) FIG. 7(b)

TRAY CONVEYING APPARATUS AND METHOD

BACKGROUND OF THE INVENTION

1. Field of the Invention

The present invention relates to a tray conveying apparatus and method, and more particularly, to an apparatus and method for removing deficient components or parts and replacing these deficient components or parts with satisfactory parts in accordance with inspection results in an external appearance inspection system for semiconductor parts (semiconductor packages, etc.).

2. Prior Art

Various types of manufacturing apparatuses and inspection apparatuses are used in manufacturing processes for semiconductor components or semiconductor parts. In such apparatuses, the semiconductor parts are generally held in a row on trays and are supplied and conveyed in tray units.

For example, in the final process in semiconductor manufacturing, a package external appearance inspection apparatus is utilized, and the external appearance of the respective packages held on the trays is inspected by means of this apparatus. Afterward, the trays are fed to a tray conveying apparatus which is linked to the inspection apparatus. In addition to the function of conveying trays, this tray conveying apparatus has the function of replacing deficient parts (defective parts and reclaimable parts (semi-defective parts), etc.) with satisfactory parts. In other words, based on the external appearance inspection results, deficient parts are removed from the trays, and the trays are replenished instead with satisfactory parts that have been prepared beforehand. After it has thus been insured that the packages on the trays consist exclusively of satisfactory parts, the trays filled with satisfactory parts are conveyed to an unloader stacker, and the respective trays are stacked in a stack configuration.

FIG. 14 is a diagram which shoes an example of one of the above-described trays 10. This tray 10 has a plurality of pockets, and a semiconductor part is accommodated in each of these pockets 12. Various types of trays other than the tray 10 shown in FIG. 14 may be used.

FIG. 15 shows one example of a conventional package external appearance inspection system. This system is constructed from an in-tray type inspection apparatus 16, which performs an inspection of the external appearance of the parts while the respective parts are accommodated in the trays, and a conveying apparatus 14, which conveys the trays in which the parts whose external appearance has been inspected are accommodated. FIG. 15 shows the appearance of the conveying apparatus 14 as seen from above.

In FIG. 15, the conveying apparatus 14 is constructed from a conveying section 17 which conveys inspected trays 10D that have been discharged from the inspection apparatus 16, an unloader staker 18 which is installed on the rear stage of the conveying section 17, a first sliding mechanism 20 which causes a table 20A on which a defective-parts tray 10B is carried top slide in the X direction, a second sliding mechanism 22 which causes a table 22A on which a reclaimable-parts tray 10Cis carried to slide in the X direction, a third sliding mechanism 24 which causes a table 24A on which a satisfactory parts tray (or satisfactory-part replenishment tray) 10A is carried to slide in the X direction, and a transfer mechanism 26 which transfer the parts.

The conveying section 17 constitutes the conveying line. The front end of this conveying section 17 is adjacent to the rear end of the conveying section (not shown) of the inspection apparatus 16, and the inspected trays 10D are fed into the conveying section 17 from the inspection apparatus 16. After all of the defective parts and reclaimable parts contained in the trays 10D have been removed, satisfactory parts are replenished in the trays 10D. Then, the trays 10D filled with satisfactory parts are sent to the unloader stacker 18, where a plurality of trays 10D are stacked in a stack configuration. The conveying section 17 has a pair of belts 30A and 30B, and the trays 10D are conveyed using these belts 30A and 30B.

In the conventional example, the sliding mechanisms 20, 22 and 24 respectively have the same structure, and have a structure which causes the respective tables 20A, 20B and 20C to slide in a direction parallel to the conveying line (i.e., in the X direction). The transfer mechanism 26 transfers defective parts from the trays 10D to the defective-parts tray in accordance with the inspection results and likewise transfers reclaimable parts from the trays 10D to the reclaimable-parts tray 10C. Here, defective parts are semiconductor parts judged to be defective in the inspection of external appearance, and reclaimable parts are semiconductor parts judged to be re-utilizable or semiconductor parts judged to require re-inspection in the inspection of external appearance. Of course, it is also possible to handle all deficient parts (or defective parts) in the same manner. As a result of the removal of defective parts and reclaimable parts, one or more empty pockets are generated in the trays 10. Accordingly, these empty pockets are replenished with satisfactory parts from the satisfactory-parts tray 10A.

The transfer of parts between trays is accomplished by the transfer mechanism 26. In this conventional example, the transfer mechanism 26 comprises a suction chucking nozzle 28 which chucks the parts by vacuum suction, and a mechanism which moves the nozzle 28 in the direction (Y direction) perpendicular to the direction of the conveying line (X direction). The coordinates at which the parts transfer operation is performed are determined by the Y-direction position of the nozzle 28 and the X-direction positions of the respective tables 20A, 22A and 24A.

Thus, in the conveying apparatus 14 shown in FIG. 15, defective parts and reclaimable parts are removed from the trays in accordance with the inspection results, the trays are replenished with satisfactory parts, and the resulting trays filled exclusively with satisfactory parts are sent to the unloader stacker 18 and accommodated therein in a stacked fashion. The frequency of generation of defective parts and reclaimable parts is generally very low in each lot; accordingly, most of the trays following inspection flow "as is" along the conveying section 17 and are sent to the unloader stacker 18.

In the conveying apparatus 14 shown in FIG. 15, it is necessary to prepare the satisfactory-parts tray 10A at the beginning of each lot. Also, a fresh satisfactory-parts tray must also be prepared in cases where the initial satisfactory-parts tray becomes an empty tray at an intermediate point in the lot This will be explained below.

When the initial tray of a lot is sent to the conveying section17, defective parts and reclaimable parts are first removed from this tray. After this removal, the tray is tentatively sent to the unloader stacker 18; and at this point in time, an operator call is output. Afterward, when this tray is manually transferred to the table 24A by the operator, the apparatus is re-started, and conveying control similar to that described above is subsequently performed.

If the satisfactory-parts tray 10A becomes an empty tray at an intermediate point in this operation, an operator call is output in the same manner as described above. Afterward, the empty tray on the table 24A is first manually removed by the operator, and a tray that has been discharged into the unloader stacker 18 is manually transferred onto the table 24A.

Besides the above-described manual method, an automatic operation by means of successive transfer may also be realized. In this automatic operation, satisfactory parts are automatically transferred one at a time to the satisfactory-parts tray 10A from a tray 10D on the conveying section 17 using the transfer mechanism 26 with the satisfactory-parts tray 10A in an empty state.

In such a manual operation, the operator must perform a manual tray exchange whenever a satisfactory-parts tray is required. As a result, considerable effort is required. Also, the operation is bothersome and inconvenient. If this operation is delayed, the interruption of conveying is extended so that the productive capacity of the production line drops.

On the other hand, in the case of the above-described automatic operation by successive transfer, the problems of bothersome manual work, etc. do not exist. However, since the satisfactory parts must be transferred one at a time, considerable time is required in order to transfer a large number of satisfactory parts. As a result, the productive capacity drops.

In a conventional apparatus, positioning of the parts at the time of pick-up and placement is accomplished by belt feeding of the trays. As a result, if the trays should slip on the belt, there is a danger of misalignment in accommodation of the parts on the trays.

SUMMARY OF THE INVENTION

Accordingly, the present invention is devised in light of the above-described conventional problems.

One object of the present invention is to allow the quick preparation of a satisfactory-parts tray in a tray conveying apparatus.

Another object of the present invention is to improve the working characteristics and reliability and to maintain or improve the treatment capacity in a tray conveying apparatus.

Another object of the present invention is to perform the transfer of parts accurately in a tray conveying apparatus.

The above objects are accomplished by a unique structure of the present invention for a tray conveying apparatus which has a conveying line that conveys trays on which a plurality of semiconductor parts are carried, wherein the tray conveying apparatus comprises:

a main station which is disposed in a movable manner in a prescribed position on the conveying line, and which conveys trays; a sub-station which is disposed in a movable manner in a position adjacent to the prescribed position on the conveying line, and which functions as a stand that carries satisfactory-part replenishment trays; a station exchanging means which exchanges stations positioned in the prescribed position on the conveying line; a part transfer means which removes deficient parts from a tray that is fed onto and positioned on the main station, and replenishes satisfactory parts in the tray from the satisfactory-part replenishment tray, in a state in which the main station is positioned in the prescribed position on the conveying line; and a control means which controls the operation of the tray conveying apparatus; and wherein the above-described control means includes: a means which positions the sub-station in the prescribed position on the conveying line instead of the main station; a means which prepares, as a satisfactory-part replenishment tray, a tray with only satisfactory parts thereon on the sub-station positioned in the prescribed position on the conveying line; and a means which positions the main station in the prescribed position on the conveying line instead of the sub-station, and positions the sub-station in the adjacent position, after the tray with only satisfactory parts thereon has been prepared.

With the above-described structure, in cases, for example, where the initial tray of a lot is conveyed, or in cases where the satisfactory-part replenishment tray (i. e., the satisfactory-parts tray) has become an empty tray, the sub-station that functions as a carrying stand for the satisfactory-part replenishment tray is first positioned in a prescribed position on the conveying line; and in this state, a satisfactory-parts tray (i. e., a tray accommodating only satisfactory parts thereon) is automatically prepared on the sub-station. In this case, a method, for example, in which all of the deficient parts are removed from a tray that has been fed onto and positioned on the sub-station can be used, or a method in which a satisfactory-parts tray that has been discharged into a discharge section from the station is returned and fed onto the sub-station, can be used. In either case, a satisfactory-parts tray is prepared on the sub-station, and the sub-station is moved from the conveying line to an adjacent position, and then the satisfactory-parts tray on the sub-station is used as a tray for satisfactory-part replenishment.

Accordingly, in the present invention, there is no need for the manual set-up of a satisfactory-parts tray. In addition, an entire tray can be transferred and utilized as a tray for satisfactory-part replenishment.

The above-described conveying line is constructed as a tray conveying path which extends from a receiving section that receives trays following inspection to a discharge section (e.g., an unloader stacker) into which the trays are discharged. It is desirable that the sub-station has a tray conveying function similar to that of the main station. For example, the sub-station and main station may use the same mechanism.

It is desirable that the present invention be applied to a semiconductor package external appearance inspection system. However, the present invention can be, of course, applied to other systems that handle semiconductor parts.

Furthermore, the above-described means that prepares a tray with only satisfactory parts thereon includes a means which feeds a tray onto the sub-station and positions the tray on the sub-station, and a means which removes all of the deficient parts from the tray on the sub-station.

In this structure, the initial tray of a lot can automatically be converted into a tray for satisfactory-part replenishment when this initial tray has been conveyed into the apparatus. Accordingly, bothersome manual work is eliminated, and the problem of a drop in treatment capacity accompanying delays in manual work is also eliminated.

The above-described means that prepares a tray with only satisfactory parts thereon includes a means which returns a tray discharged into the discharge section of the conveying line to the sub-station, and positions the tray on the sub-station In such a structure, in cases where, for example, the satisfactory-part replenishment tray has become empty at an intermediate point in the lot, the empty tray can be removed by a method that will be described later, and a tray filled with satisfactory parts can be automatically set on the sub-station as a satisfactory-part replenishment tray in place of the empty tray. Here, the tray is, for example, discharged onto an unloader-side conveyor used as a discharge part, and is positioned on the sub-station from this conveyor.

Furthermore, in the present invention, the above-described main station and the sub-station are installed parallel to each other, and the station exchanging means includes a station sliding mechanism which causes both of the stations to move horizontally in a direction perpendicular to the conveying line.

In this structure, station exchange can be realized by means of a simple mechanism, so that the cost of the apparatus can be reduced.

The present invention may further include at least one table which carries a deficient-parts tray, and a table sliding mechanism which positions the table above the substation positioned in the adjacent position.

In this structure, the satisfactory-part replenishment tray can be positioned in a position adjacent to the conveying line. In addition, the deficient-parts tray can be positioned above this position. Accordingly, the total stroke of the part transfer means can be shortened, and a rapid transfer of parts can be accomplished.

A defective-parts tray and a reclaimable-parts tray may be cited as examples of the deficient-parts tray.

By installing the defective-parts table on which a defective-parts tray is carried and the reclaimable-parts table on which a reclaimable-parts tray in a hierarchical relationship, either of the tables can be slid and positioned above the above-described adjacent position. Accordingly, the stroke of the part transfer means can be shortened, and a rapid transfer of parts can be accomplished.

Furthermore, the present invention may include an empty tray stacker which, when the satisfactory-part replenishment tray has become an empty tray, receives the empty tray from the sub-station, and accommodates therein the empty tray. With such a special empty tray stacker, manual handling of the empty trays is no longer required, and the work burden can be further lightened.

Furthermore, in the present invention, when the satisfactory-part replenishment tray has become an empty tray, the sub-station is positioned in the prescribed position on the conveying line, and the empty tray is discharged using the conveying line. In cases where no special stacker is employed, manual removal of the empty trays is simplified by utilizing the conveying line to discharge the empty trays.

In the present invention, the above-described part transfer means includes a suction chucking nozzle which holds the semiconductor parts by vacuum suction, and a nozzle moving mechanism which moves the suction chucking nozzle in three dimensions. With this structure, since there is no combined use of belt conveying of the trays during the transfer of pat, problems caused by tray slippage can be prevented in advance.

The above-described objects are accomplished by unique steps of the present invention for a tray conveying method in which trays on which a plurality of semiconductor parts are carried are conveyed over a conveying line, deficient parts are removed from trays positioned in a prescribed position on the conveying line, and satisfactory parts are replenished; and in the present invention, the method comprises: a step in which a substation is positioned in a prescribed position on the conveying line; a step in which a tray is fed onto and positioned on the sub-station positioned in the prescribed position on the conveying line; a step in which a satisfactory-part replenishment tray is prepared by removing all of the deficient parts from the tray on the sub-station positioned in the prescribed position on the conveying line; and a step in which the sub-station on which the satisfactory-part replenishment tray is withdrawn from the conveying line, and the main station which performs tray conveying is positioned in the prescribed position on the conveying line instead of the substation.

In addition, the above-described objects are accomplished by further unique steps of the present invention for a tray conveying method in which trays on which a plurality of semiconductor parts are carried are conveyed over a conveying line, deficient parts are removed from trays positioned in a prescribed position on the conveying line, and satisfactory parts are replenished; and in the present invention, the method comprises: a step in which a substation is positioned in a prescribed position on the conveying line; a step in which a tray that has been discharged into the discharge section of the conveying line is returned and positioned as a satisfactory-part replenishment tray on the sub-station positioned in the prescribed position on the conveying line; and a step in which the substation on which the satisfactory-part replenishment tray is withdrawn from the conveying line, and the main station which performs tray conveying is positioned in the prescribed position on the conveying line instead of the sub-station.

DETAILED DESCRIPTION OF THE PREFERRED EMBODIMENTS

Preferred embodiments of the present invention will be described below with reference to the accompanying drawings.

Figure 1:
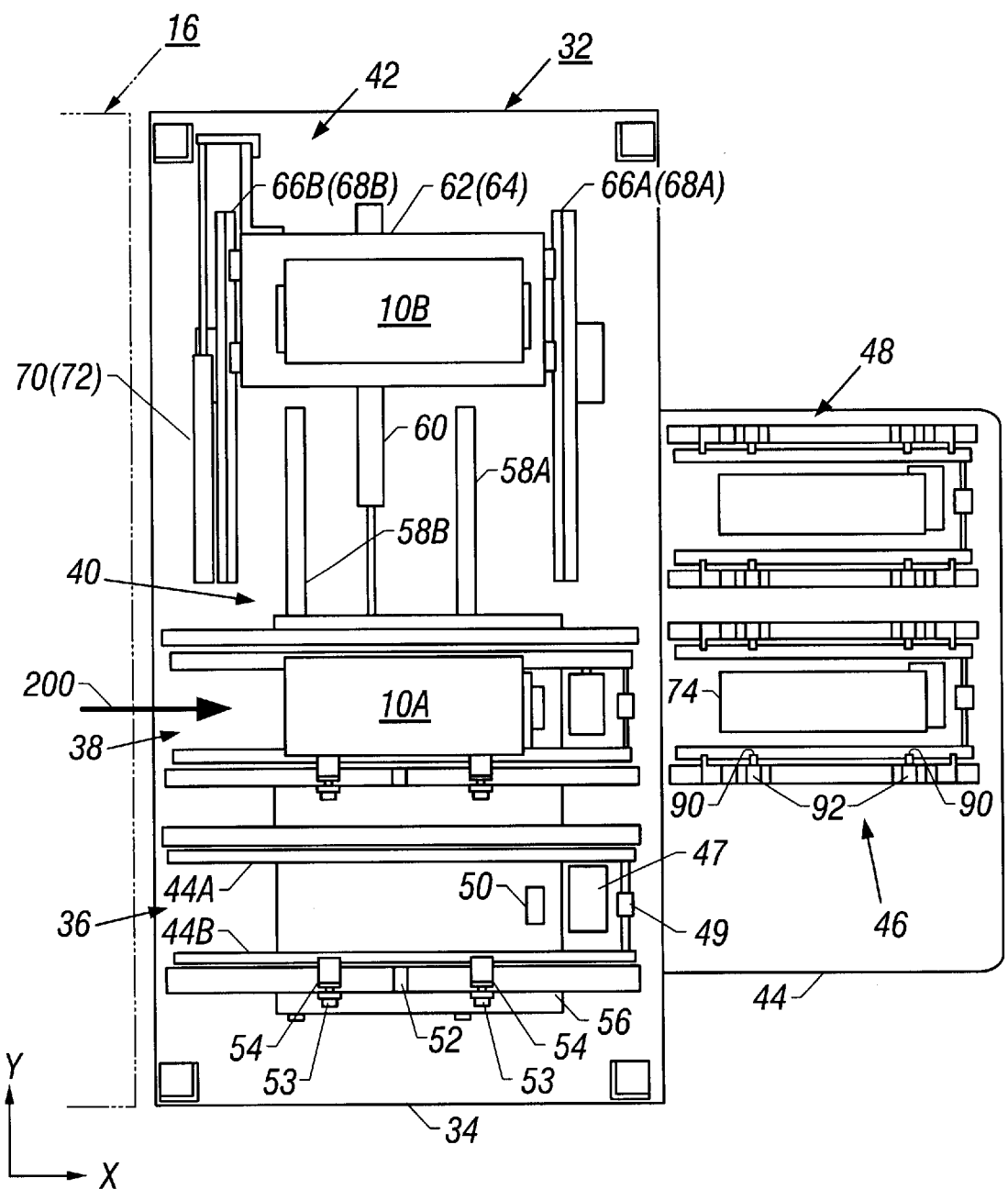
FIG. 1 is a plan view which illustrates a preferred embodiment of the tray conveying apparatus of the present invention.
Figure 2:
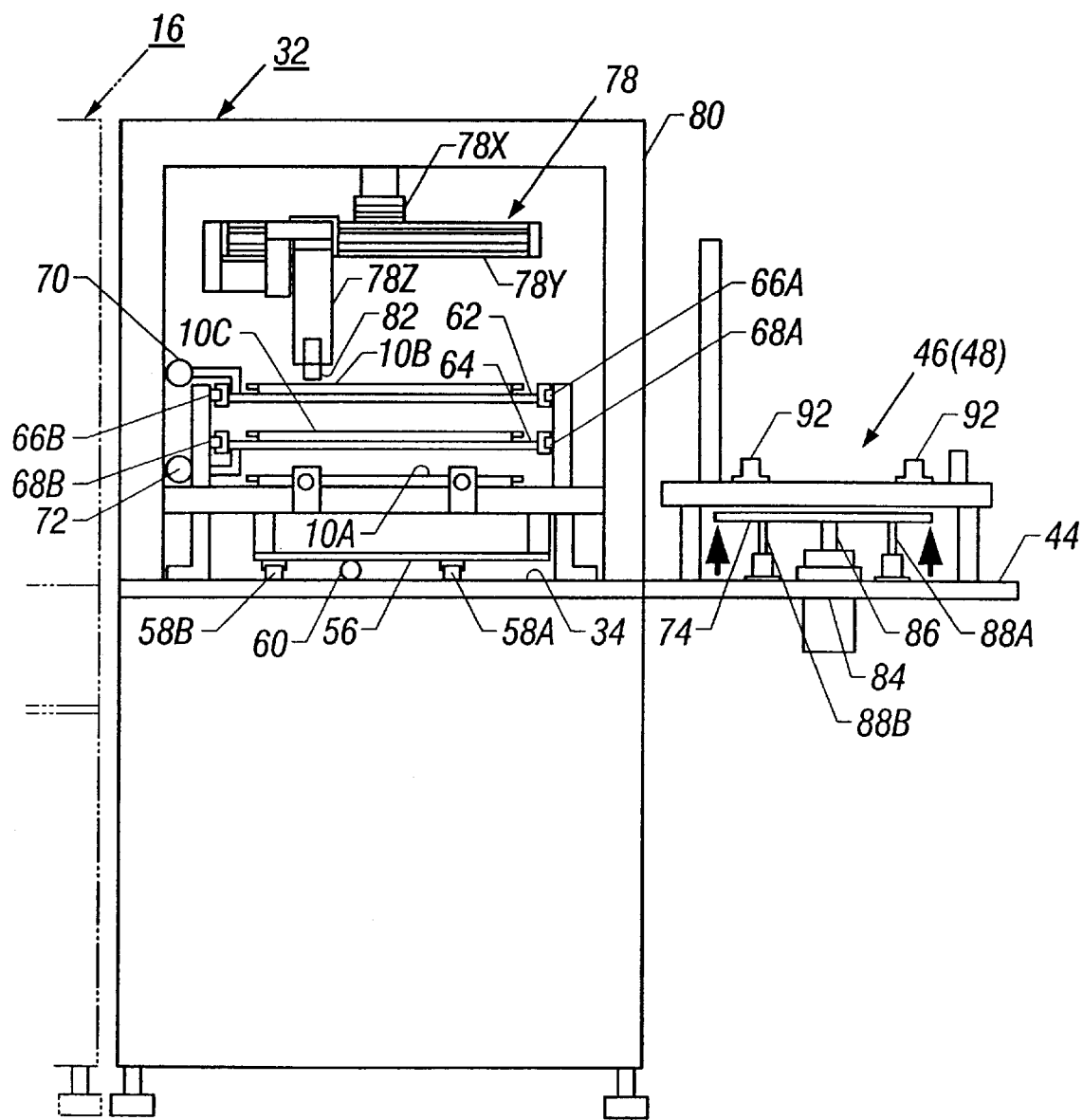
FIG. 2 is a front view which illustrates a preferred embodiment of the tray conveying apparatus of the present invention.

The semiconductor part external appearance inspection system used in the present invention is shown in FIGS. 1 and 2. FIG. 1 is a plan view, and FIG. 2 is a front view.

Figure 14:
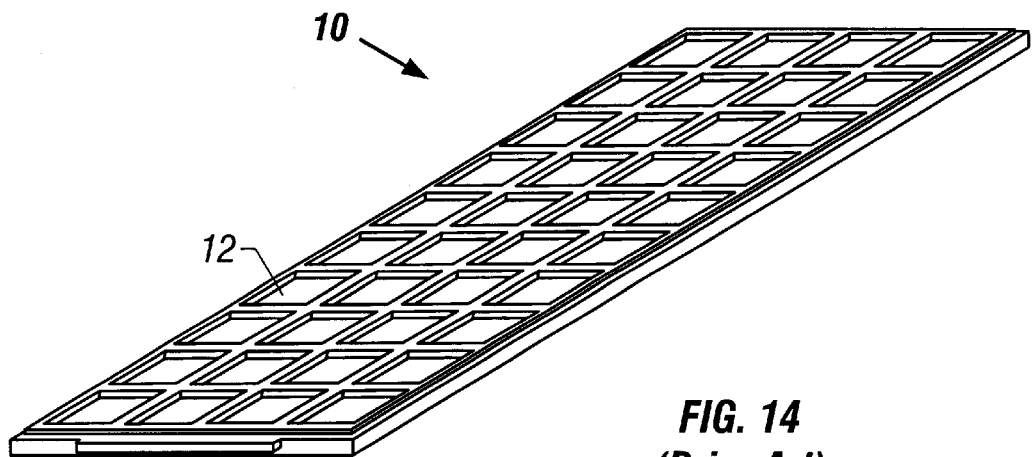
FIG. 14 is a perspective view which shows a typical tray.
Figure 15:
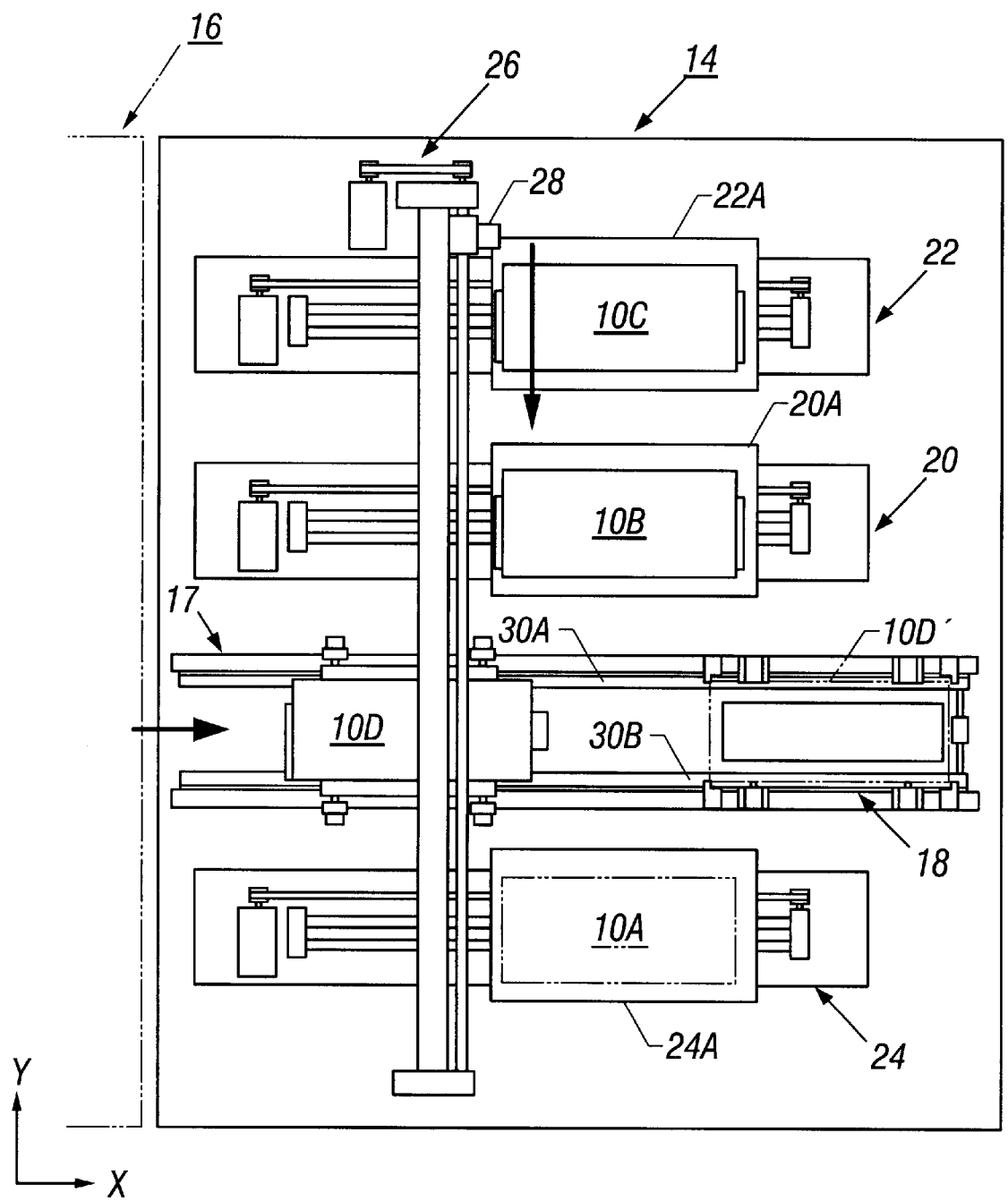
FIG. 15 is a plan view of a conventional tray conveying apparatus.

In terms of main parts, this system is constructed from an inspection apparatus 16 and a conveying apparatus 32. The inspection apparatus 16 has a function similar to that of the apparatus shown in FIG. 15. More specifically, inspection apparatus 16 inspects, by means of optical observation, respective semiconductor parts (e. g., bending of the leads of such parts, and external appearance and shape, etc.) held on the trays. The conveying apparatus 32 conveys the trays on which the inspected parts are accommodated and also has a part exchanging function. In concrete terms, in a state in which each tray is temporarily stopped in a prescribed position on the conveying line during the conveying of the tray, i. e., in a state in which the tray is positioned in the prescribed position, deficient parts (defective parts or reclaimable parts) are removed and replaced with satisfactory parts in accordance with the inspection results. The trays that are conveyed are, for example, of the type shown in FIG. 14. However, the present invention is not limited to such trays, and various types of trays may be used Examples of the semiconductor parts (packages) include QFP (quad flat packages), BOA (ball grid arrays), CSP (chip scale packages), and others.

In FIGS. 1 and 2, the conveying apparatus 32 is constructed from a main station 36, a sub-station 38, a Y-direction station sliding mechanism 40, a Y-direction table sliding mechanism 42, an unloader stacker 46, an empty tray stacker 48 and a three-dimension transfer mechanism 78 (see FIG. 2). In FIG. 1, the sub-station 38 is positioned on the conveying line 200; however, during ordinary operation, the main station 36 is positioned on the conveying line 200. Here, the conveying line 200 is a linear tray conveying path which extends from a tray receiving section to the unloader stacker 46.

The main station 36 has a pair of belts 44A and 44B on which the trays are carried and conveyed. The rotational force of a motor 47 is transmitted to one of the belts 44A, and this transmitted rotational force is also transmitted to the other belt 44B by means of a joint 49. A stopper 50 is utilized when a tray is to be stopped and positioned on the main station. A sensor 52 detects the presence or absence and positions of the trays, and one or more of such sensors 52 may be installed as required. A damper 54 is used to press and fasten in place the trays that are fed onto the main station 36, and this damper 54 is driven by a cylinder 53. The trays that are fed onto the main station 36 are correctly positioned in a prescribed position on the main station 36 by such a mechanism. After the transfer of semiconductor parts onto a tray has been completed, the fastening of the tray is released, and the tray is conveyed. The conveying of trays will be described in detail later with reference to FIGS. 9(a) through 9(d), etc.

The sub-station 38 is installed adjacent to the main station 36 and parallel to the main station 36. The sub-station 38 functions as a stand on which a satisfactory-parts tray (satisfactory-part replenishment tray) is carried. In the present embodiment, the sub station 38 has the same structure as the main station 36. Accordingly, a description of the detailed structure is omitted.

The station sliding mechanism 40 that moves in the Y direction is disposed on the apparatus main body 34. The station sliding mechanism 40 comprises a sliding plate 56 on which both stations 36 and 38 are carried, a cylinder 60 which drives this sliding plate, and two guide rails 58A and 58B which guide the horizontal sliding movement of the sliding plate. Thus, the station sliding mechanism 40 makes it possible to cause both stations 36 and 38, which are disposed parallel to each other, to slide as a unit in the direction perpendicular to the conveying line 200 (i. e., the Y direction) as required. In other words, the stations 36 and 38 are interchangeably positioned on the conveying line 200.

When the sub-station 38 is positioned in the above-described prescribed position on the conveying line 200, the main station 36 is positioned in an adjacent position located to one side of the conveying line 200 (see FIG. 1). On the other hand, when the main station 36 is positioned in the abovedescribed prescribed position on the conveying line 200, the sub-station 38 is positioned in an adjacent position located on the other side of the conveying line 200 (or adjacent position on the side of the table sliding mechanism).

As seen from FIGS. 1 and 2, a table sliding mechanism 42 is disposed on the apparatus main body 34. The table sliding mechanism 42 has an upper-stage table 62 and a lower-stage table 64, which have a hierarchical relationship with each other. The upper-stage table 62 carries a defective-parts tray 10B thereon, and the lower-stage table 64 carries a reclaimable-parts tray 10C thereon (see FIG. 2). The upper-stage table 62 is guided by a pair of guide rails 66A and 66B so that it is moved horizontally in a direction perpendicular to the conveying line 200 (i. e., in the Y direction). Likewise, the lower-stage table 64 is also guided by a pair of guide rails 68A and 68B and moved horizontally in a direction perpendicular to the conveying line 200 (i. e., in the Y direction).

The respective tables 62 and 64 are driven by cylinders 70 and 72, respectively. As will be described later, the respective tables 62 and 64 are positioned above the above-described adjacent position located on the other side of the conveying line as a result of their advancing slide. In other words, in the state in which the main station 36 is positioned on the conveying line 200, the sub-station is positioned in the above-described adjacent position on the other side; and the defective-parts tray 10B or reclaimable-parts tray 10C can be positioned above the sub-station as required. Because of such a positional relationship and as a result of the hierarchical relationship of the three trays, i. e., the satisfactory-parts tray 10A, the defective-parts tray 10B and the reclaimable-parts tray 10C, the stroke of the nozzle required in order to transport parts in the three-dimensional transfer mechanism 78 (i. e., the stroke in the direction perpendicular to the conveying line 200 (Y direction)) can be shortened compared to the stroke in a conventional apparatus, and the treatment capacity of the apparatus can be increased.

Furthermore, a base 44 is provided on side of the apparatus main body 34 so as to extend in the horizontal direction, and an unloader stacker 46 and empty tray stacker 48 are installed on this base 44. In concrete terms, the unloader stacker 46 is installed so as to align to the conveying line 200, so that the stacker 46 can accommodate trays from the main station 36, etc. The empty tray stacker 48 is installed in a position which forms an adjacent conveying line together with the sub-station 38 in a state in which the sub-station 38 is positioned in the above-described adjacent position located on the other side of the conveying line. In other words, when the satisfactory-part replenishment tray on the substation 38 has become empty, this empty tray is fed out to the empty tray stacker 48 in this state.

In the above embodiment, the unloader stacker 46 and empty tray stacker 48 have the same structure. The detailed structure will be described below only for the unloader stacker 46.

The unloader stacker 46 has a belt conveying mechanism (pair of belts, motor and joint) similar to that of the main station 36 and sub-station 38. In addition, as shown in FIG. 2, the unloader stacker 46 has a stacking mechanism including a raising-and-lowering plate 74 which is used for successive stacking of the respective plates from below. The raising-and-lowering plate 74 operates upward from a point beneath the conveyor belt inside the unloader stacker. The plate 74 is driven by a motor 84. In concrete terms, the driving force of the motor 84 is transmitted to the raising-and-lowering plate via a feed screw 86. During the raising and lowering, the raising and lowering movement is guided by guide shafts 88A and 88B. When a tray is lifted by the raising-and-lowering plate 74, a plurality of pawls 90 (see FIG. 1) are caused to protrude beneath the lowermost lifted tray by the action of cylinders 92. When the raising-and-lowering plate 74 is lowered in this stage, the lowermost tray is supported by the pawls 90. By repeating this process, trays are stacked successively from below and accommodated in stack. This mechanism itself is already known.

In FIG. 2, the three-dimensional transfer mechanism 78 is provided on the ceiling of the apparatus frame 80. This three-dimensional transfer mechanism 78 has a suction chucking nozzle 82 that is used for the individual conveying of parts (defective parts, reclaimable parts and satisfactory parts). The suction chucking nozzle 82 can be freely driven in three dimensions by an X-driving device 78X which performs driving in the X direction, a driving device 78Y which performs driving in the Y direction, and a Z driving device 78Z which performs driving in the Z direction. Thus, since the pick-up position is not determined by belt conveying, problems caused by slipping of the trays, etc., can be eliminated.

Figure 3:
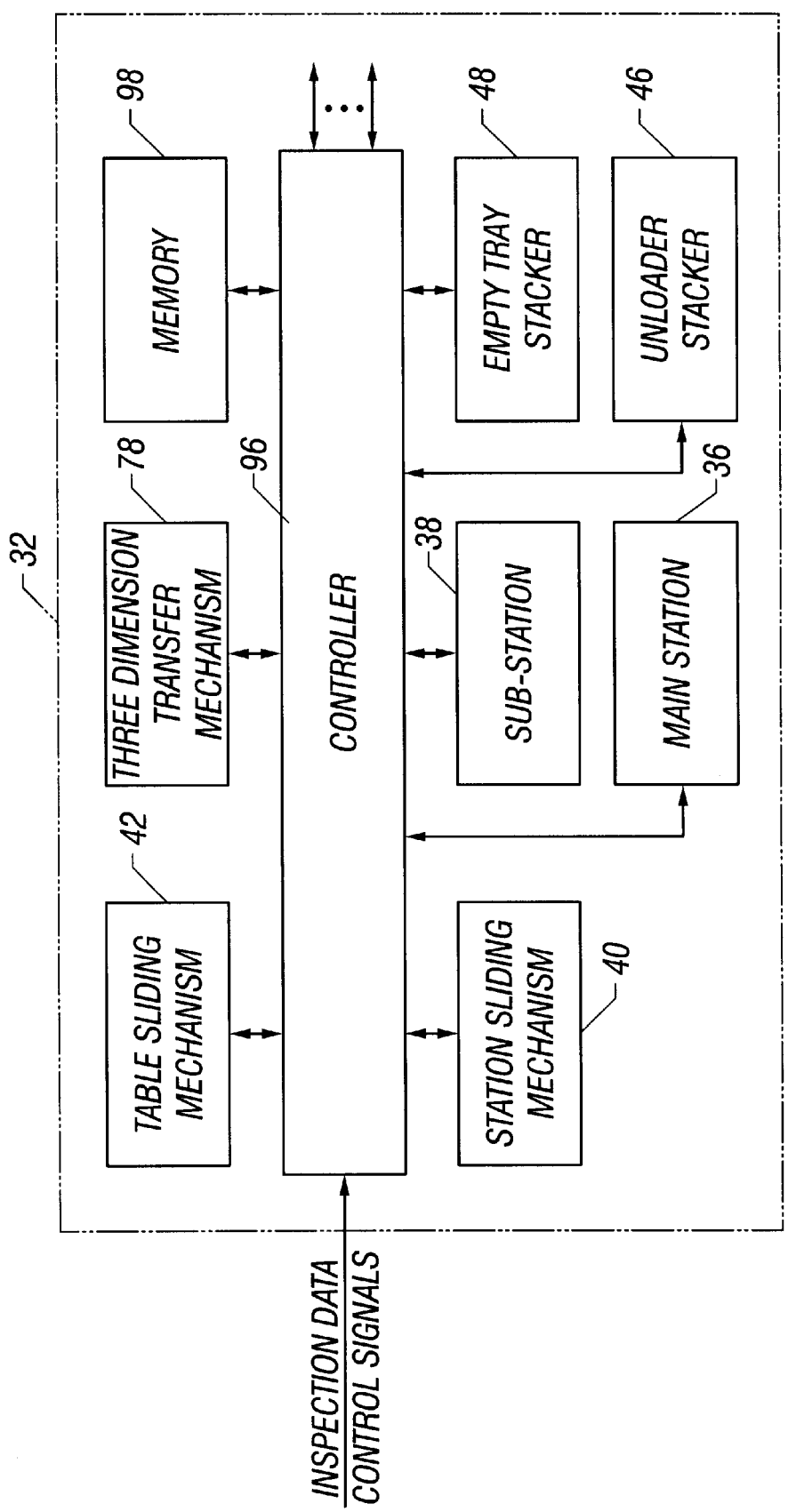
FIG. 3 is a block diagram which illustrates the controller that controls the apparatus.

FIG. 3 shows a controller 96 of the conveying apparatus 32.

This controller 96 is, for instance, a micro-computer and controls the above=95 described constituting elements 36, 38, 40, 42, 46, 48 and 78, etc. inside the conveying apparatus 32 on the basis of control signals and inspection data (inspection results) from the inspection apparatus. The controller 96 also outputs signals and data as required. A memory 98 is connected to the controller 96, and data required for operational control of the apparatus is stored in this memory 98. For example, addresses of the respective parts on the trays and inspection results, etc., outputted from the inspection apparatus are stored in the memory 98, and this information is utilized for the control.

Next, the operation of the conveying apparatus 32 will be described using the flow charts shown in FIGS. 4 and 5 with reference to FIGS. 1 and 2.

Figure 4:
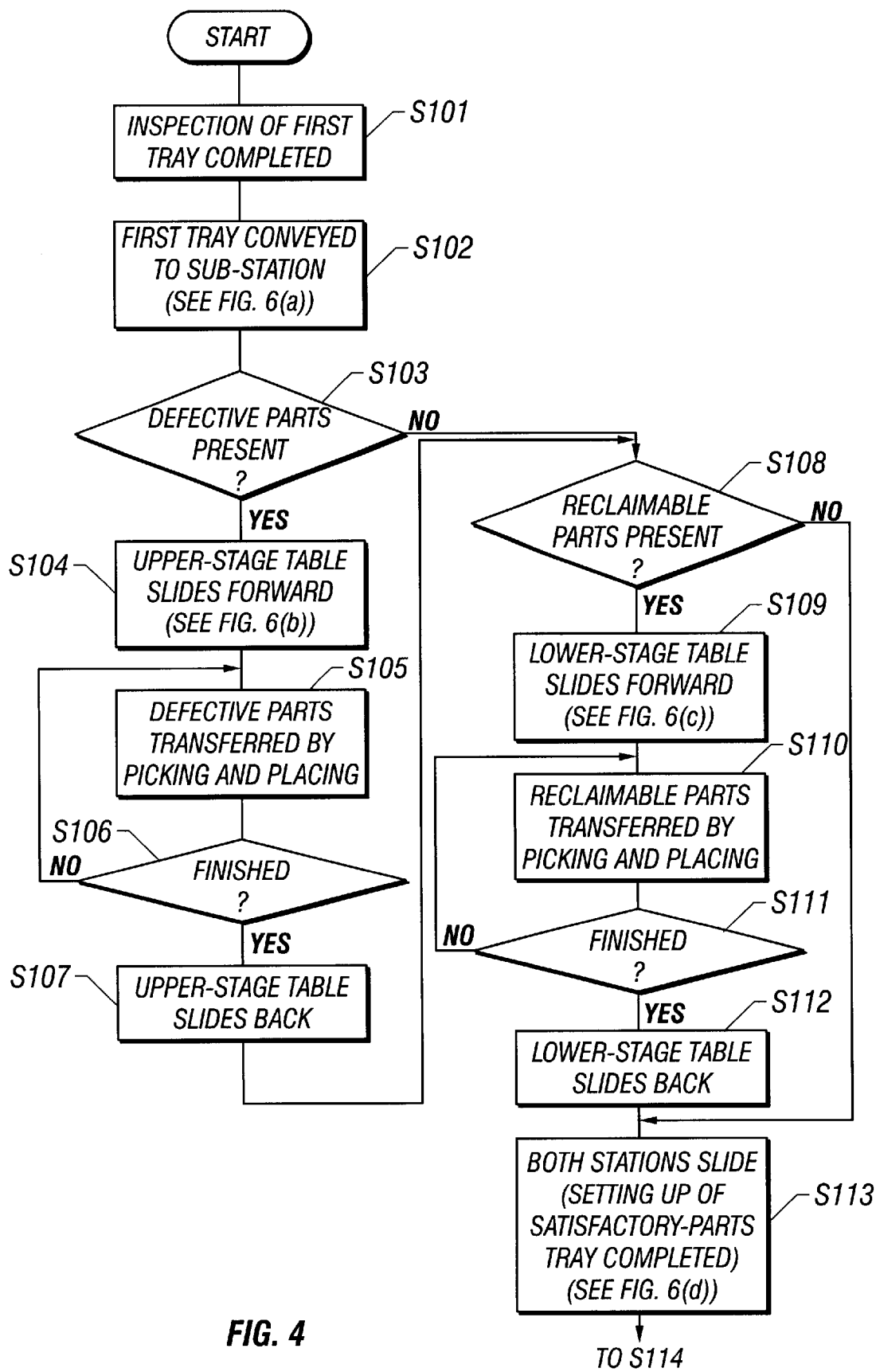
FIG. 4 is a flow chart which illustrates the operation of the apparatus of the present invention.
Figure 5:
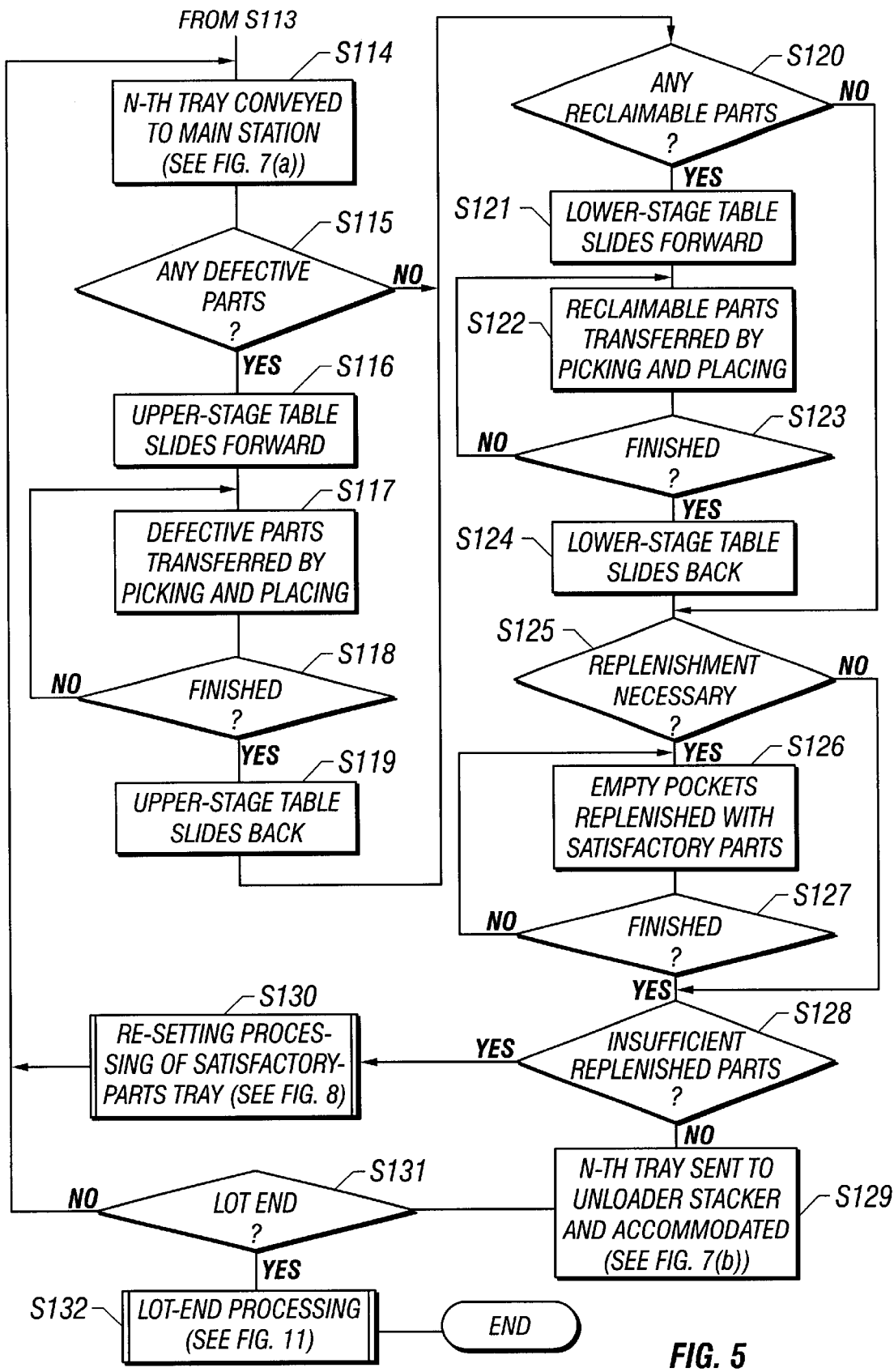
FIG. 5 is a flow chart which illustrates the operation of the apparatus of the present invention.

FIG. 4 shows the process of setting up the satisfactory-parts tray at the beginning of a lot, and FIG. 5 shows the subsequent operation including the re-setting process S130 which is executed at an intermediate point in the lot. Prior to the operation of the apparatus, the sub-station 38 is positioned on the conveying line 200 as shown in FIG. 1.

Figure 6A:
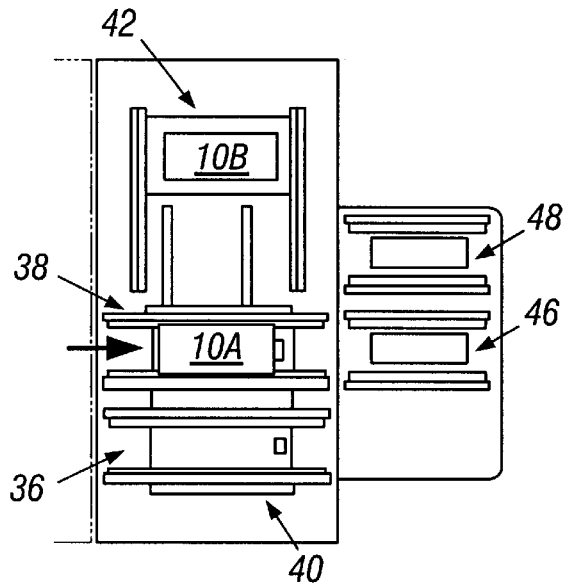
FIG. 6(*a*) through 6(*d*) are explanatory diagrams which illustrate the operation of the apparatus of the present invention.

As shown in FIG. 4, when the inspection of the initial tray of the lot (first tray) is completed in S101, this first tray 10A is fed onto the sub-station 38 in S102. This state is shown in FIG. 6(a).

In S103, ajudgement is made pursuant to the inspection data outputted from the inspection apparatus 16 as to whether or not defective parts are present among the plurality of parts on the tray 10A. If there are no defective parts, the process from SI08 on is performed; and if defective parts are present, the process from S104 on is performed.

Figure 6B:
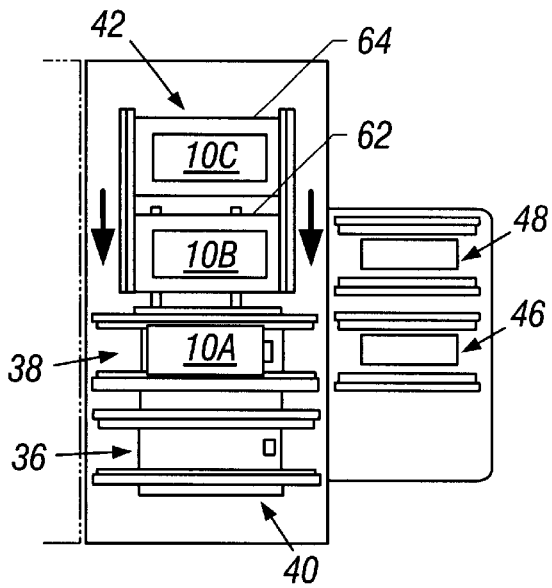

In S104, the upper-stage table 62 on which the defective-parts tray 10B is carried slides forward, and the defective-parts tray 10B is positioned above the abovedescribed adjacent position This state is shown in FIG. 6(b).

In S105, the defective parts on the tray 10A are transferred one at a time onto the defective-parts tray 10B. This transfer is performed by the three-dimensional transfer mechanism 78.

When it is judged that all of the defective parts have been removed from the tray 10A in S106, the upper-stage table 62 slides back and is returned to its original position in S107.

Figure 6C:
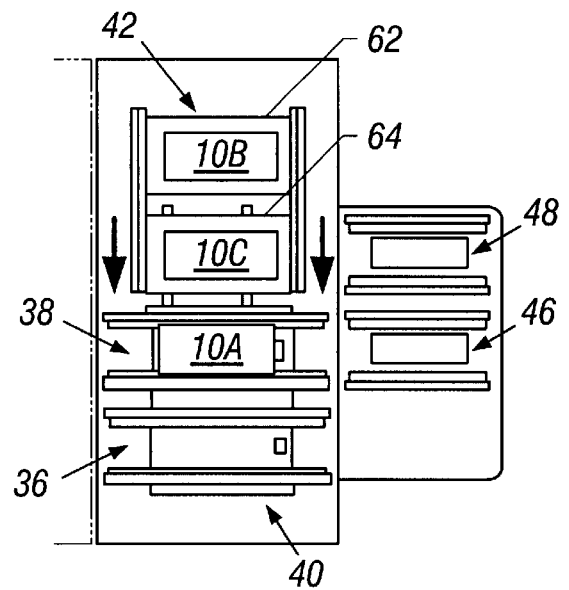

In S108, a judgement is made in accordance with inspection data as to whether or not reclaimable parts are present on the tray 10A. In this case, if no reclaimable parts are present, the process from S113 on is performed; and if reclaimable parts are present, the lower-stage table 64 slides forward and is positioned above the above-described adjacent position in S109. This state is shown in FIG. 6(c).

In this state in which the lower-stage table 64 is positioned, the reclaimable parts on the tray 10A are transferred one at a time onto the reclaimable-parts tray 10C which is on the lower-stage table 64 in S110.

When it is judged that the transfer of all of the reclaimable parts has been completed in S111, the lower-stage table 64 slides back and is returned to its original position in S112.

As a result of the above-described process, the process in which the tray 10A is converted into a satisfactory-parts tray that contains satisfactory parts only is completed In other words, the work of preparing a satisfactory-parts tray on the sub-station 38 is completed.

Figure 6D:
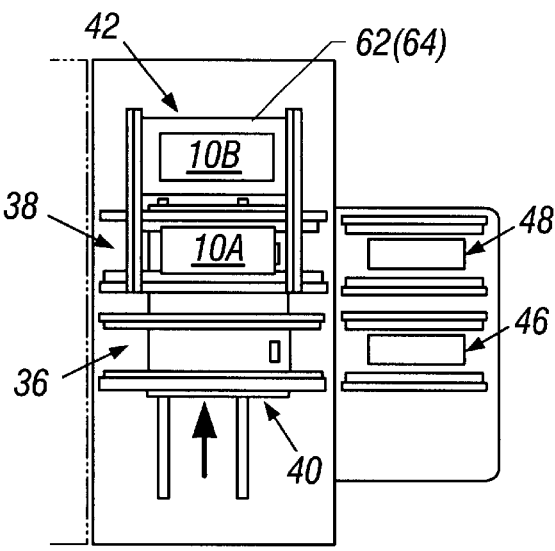

In S113, the main station 36 and sub-station 38 are caused to slide as a unit in the direction perpendicular to the conveying line 200 by the station sliding mechanism 40. This state is shown in FIG. 6(d). The state shown in this FIG. 6(d) is the ordinary operating state; and in this state, the satisfactory-parts tray 10A is positioned in the above-described adjacent position which is adjacent to the conveying line 200.

FIG. 5 shows the process from S114 to S131 (excluding S130); and this process is performed each time when a tray is discharged form the inspection apparatus 16.

Figure 7C:
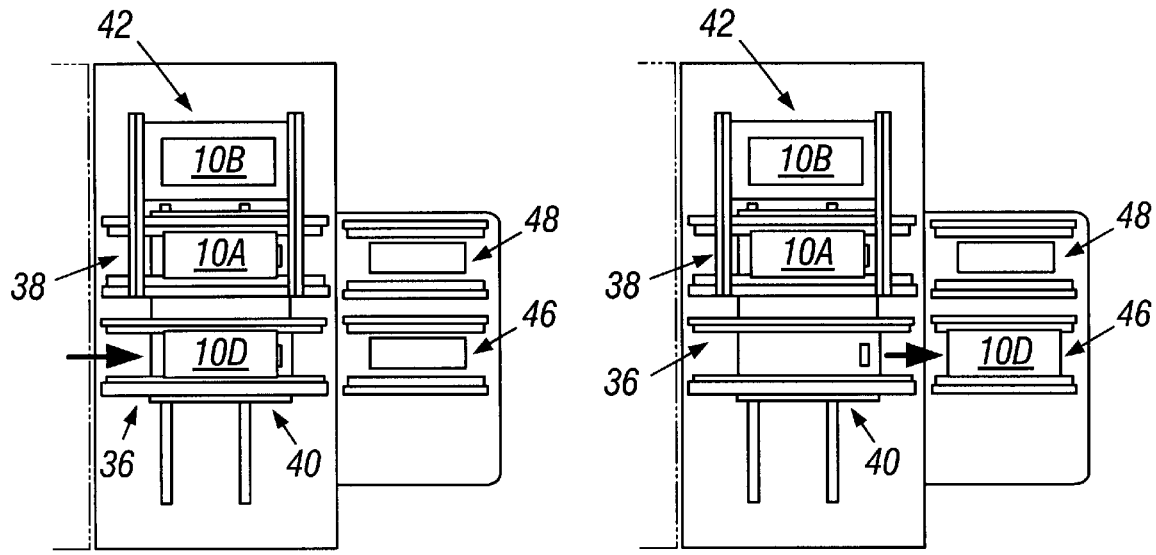
FIG. 7(*a*) through 7(*c*) are explanatory diagrams which illustrate the operation of the apparatus of the present invention.

In S114, the n-th (e. g., the second) tray is fed onto the main station 36. This state is shown in FIG. 7(a), and the symbol 10D is assigned to this tray.

In S115, a judgement is made in accordance with inspection data as to whether or not defective parts are present on the tray 10D. If no defective parts are present, the process from S120 on is performed; and if defective parts are present, the process from S116 on is performed.

In S116, the upper-stage table 62 slides forward, and the defective-parts tray 10B on this table 62 is positioned above the satisfactory-parts tray 10A.

In S117, the defective parts on the tray 10D are transferred one at a time to the defective-parts tray 10B by the three-dimensional transfer mechanism 78.

When it is judged that all of the defective parts have been removed in S118, the upper-stage table 62 slides back into its original position in S119.

In S120, a judgement is made as to whether or not any reclaimable parts are contained in the tray 10D on the main station 36. If no reclaimable parts are present, the process from S125 on is performed; and if reclaimable parts are present, the process from S121 on is performed.

In S121, the lower-stage table 64 slides forward, and the reclaimable-parts tray carried on the lower-stage table 64 is positioned above the satisfactory-parts tray 10A positioned on the sub-station 38.

In S122, the reclaimable parts are transferred one at a time from the tray 10D to the reclaimable-parts tray 10C.

When it is judged in S123 that the transfer of all of the reclaimable parts has been completed, the lower-stage table 64 slides back into its original position in S124.

In S125, a judgement is made as to whether or not satisfactory-part replenishment is necessary for the tray 10D. In other words, ajudgement is made as to whether or not there was at least one defective part or reclaimable part on the tray 10D. If it is judged in S125 that there is no need for replenishment, the process from S128 on is performed. If, on the other hand, it is judged that replenishment is necessary, then satisfactory parts are transferred one at a time from the satisfactory-parts tray 10A on the substation 38 to the tray 10D on the main station 36 in S126. As a result, all of the empty pockets of the tray 10D are replenished with satisfactory parts.

When it is judged in S127 that satisfactory-part replenishment has been completed, S128, which will be described below, is performed. S128 may also be performed in cases where it is judged in S127 that there is not a single satisfactory part on the satisfactory-parts tray 10A.

In S128, a judgement is made as to whether or not the satisfactory-parts tray 10A has become an empty tray. If satisfactory parts still remain on the satisfactory-parts tray 10A, S129 is performed; and if the satisfactory-parts tray 10A has become an empty tray, then S130 is performed.

Figure 7C:
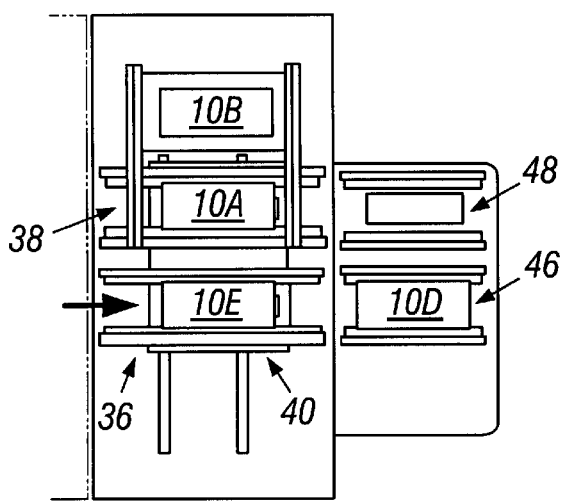

In S129, the n-th tray filled with satisfactory parts is conveyed from the main station 36 to the unloader stacker 46 and is stacked and accommodated in the unloader stacker 46. In other words, the tray is stored in a stacked configuration. This state is shown in FIG. 7(*b*). Meanwhile, in S130, satisfactory-parts tray re-setting processing, i. e., satisfactory-parts tray re-preparation processing, is performed. This will be described in detail later with reference to FIG. 8.

In S131, a judgement is made as to whether or not processing has been completed for all of the trays in a certain lot. If it is judged that the final tray has not yet been reached, the respective processes from S114 on are repeated; and if it is judged that the lot has ended, this entire routine is completed after the lot-end processing is performed in S132. Lot-end processing will be described in detail later with reference to FIG. 11.

The satisfactory-parts tray re-setting processing (S130) will be described next using FIG. 8 with reference to FIGS. 9(*a*) through 9(*d*).

In FIG. 9(*a*), an empty tray 10A is on the sub-station 38, and a tray 10E with only satisfactory parts thereon is carried on the main station 36. In other words, the tray 10E is a tray which has passed through the processes up to S127 shown in FIG. 5.

With the state described above, in S201, the empty tray 10A is conveyed "as is" from the sub-station 38 parallel to the conveying line and is sent to the empty tray stacker 48. Empty trays are stacked and accommodated in this empty tray stacker 48. This state is shown in FIG. 9(*b*).

In S202, the n-th tray (i. e., the tray 10E) on the main station is temporarily sent to the unloader stacker 46, and this tray 10E is temporarily withdrawn. This state is shown in FIG. 9(*c*). In this state, the tray 10E is still not stacked; instead, the tray 10E is held on the belt of the unloader stacker 46.

In S203, the main station 36 and sub-station 38 are caused to slide as an integral unit by the station sliding mechanism 40; as a result, the sub-station 38 is positioned on the conveying line 200. This is shown in FIG. 9(*d*).

Figure 10A:
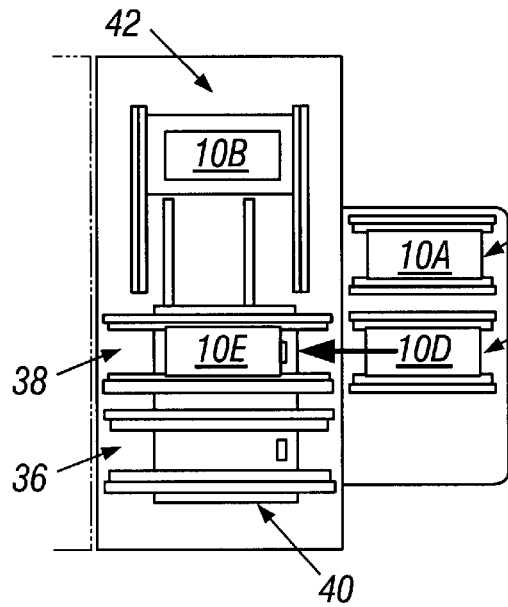
FIG. 10(*a*) through 10(*c*) are explanatory diagrams which illustrate the operation of the apparatus of the present invention.
Figure 10B:
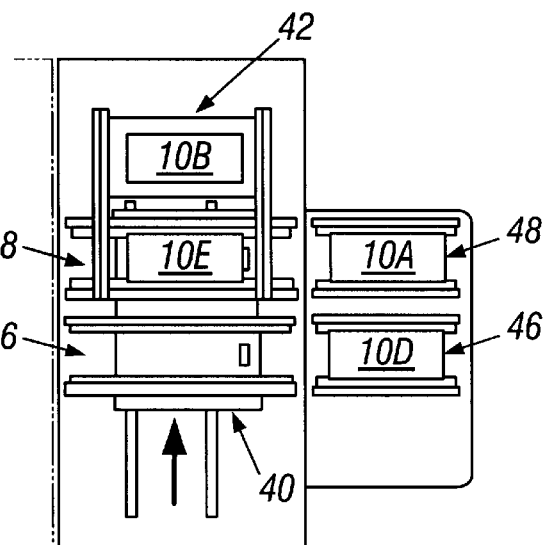
Figure 10C:
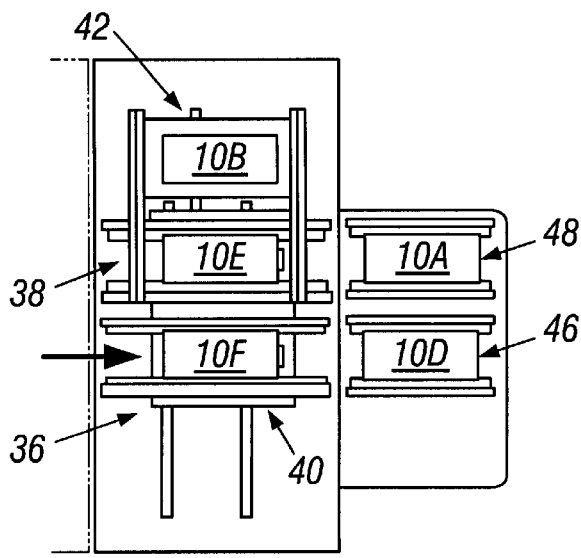

In S204, the tray 10E which had been temporarily withdrawn to the unloader stacker 46 is returned to the conveying line 200 and is fed onto the sub-station 38. This is shown in FIG. 10(*a*).

In S205, the main station 36 and substation 38 are caused to slide by the station sliding mechanism 40, and the main station 36 is positioned on the conveying line 200. This state is shown in FIG. 10(*c*).

Figure 8:
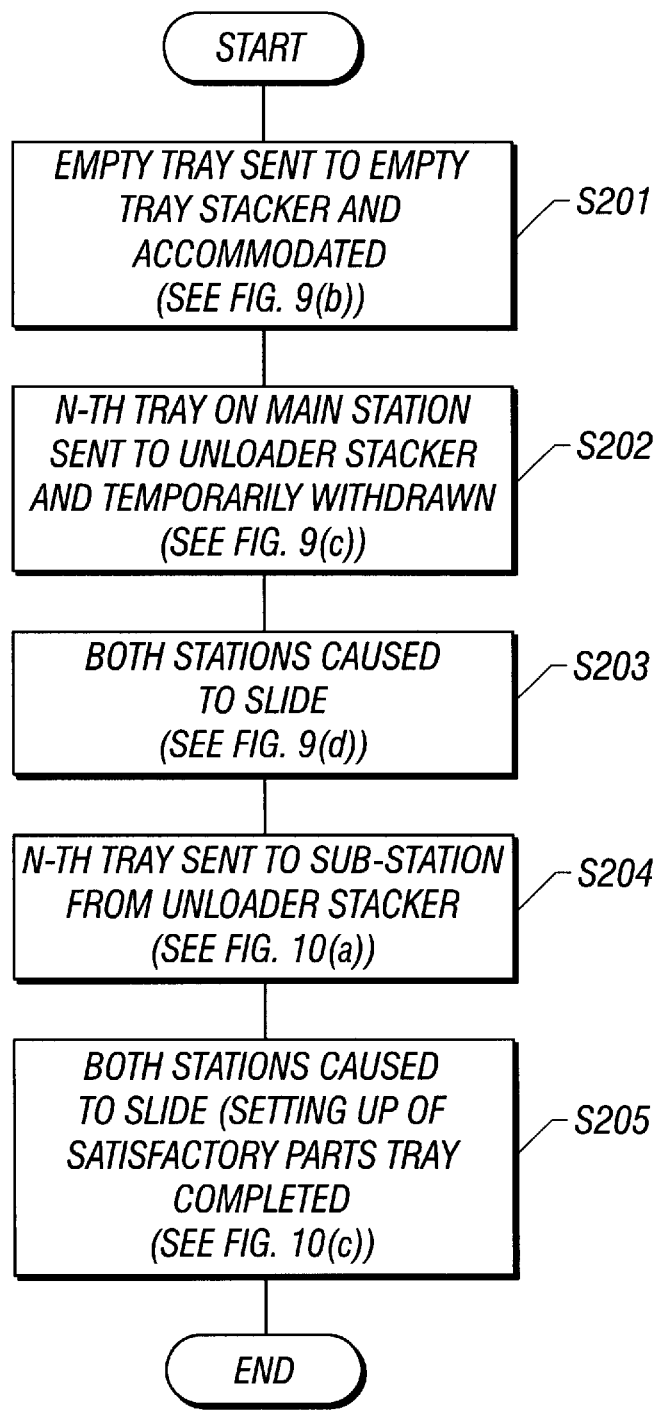
FIG. 8 is a flow chart which illustrates the re-setting processing.
Figure 9A:
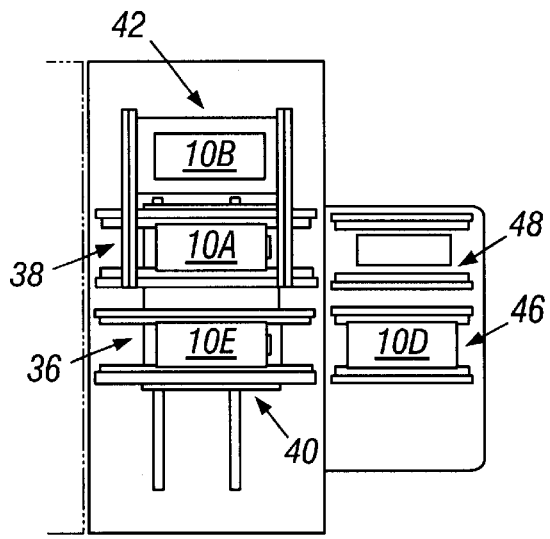
FIGS. 9(*a*) through 9(*d*) are explanatory diagrams which illustrate the operation of the apparatus of the present invention.
Figure 9B:
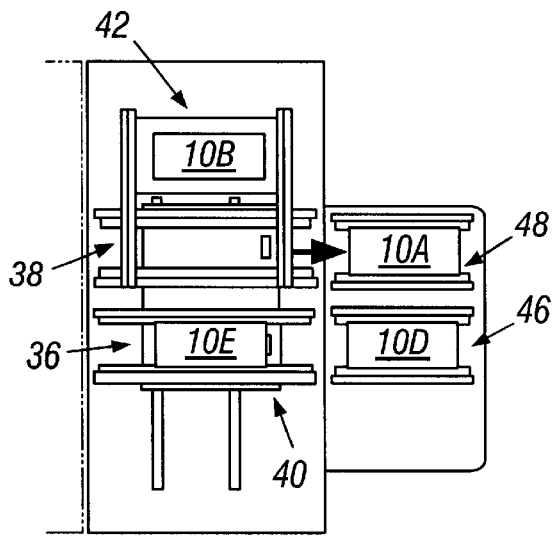
Figure 9C:
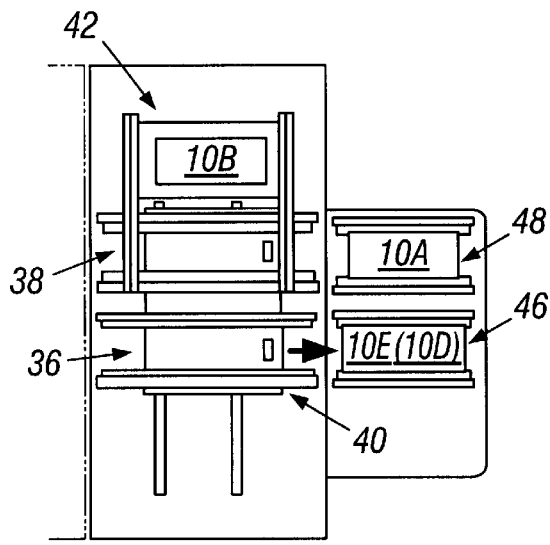
Figure 9D:
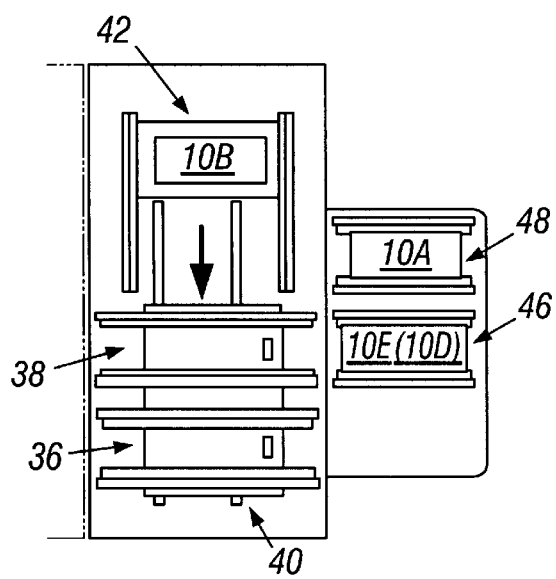

As seen from the above, by means of this re-setting processing shown in FIG. 8, the tray 10E filled with satisfactory parts can be temporarily withdrawn from the main station 36, and the tray 10A can be placed on the sub-station 38 and prepared via station sliding. Accordingly, the following advantage is obtained: an operation in which satisfactory parts are transferred to the satisfactory-parts tray one at a time as in conventional devices is unnecessary, and satisfactory-parts trays can be prepared in tray units. Also, since empty trays are automatically accommodated in the empty tray stacker 48, no work by the operator is required, and inconvenience to the operator is eliminated.

Figure 12:
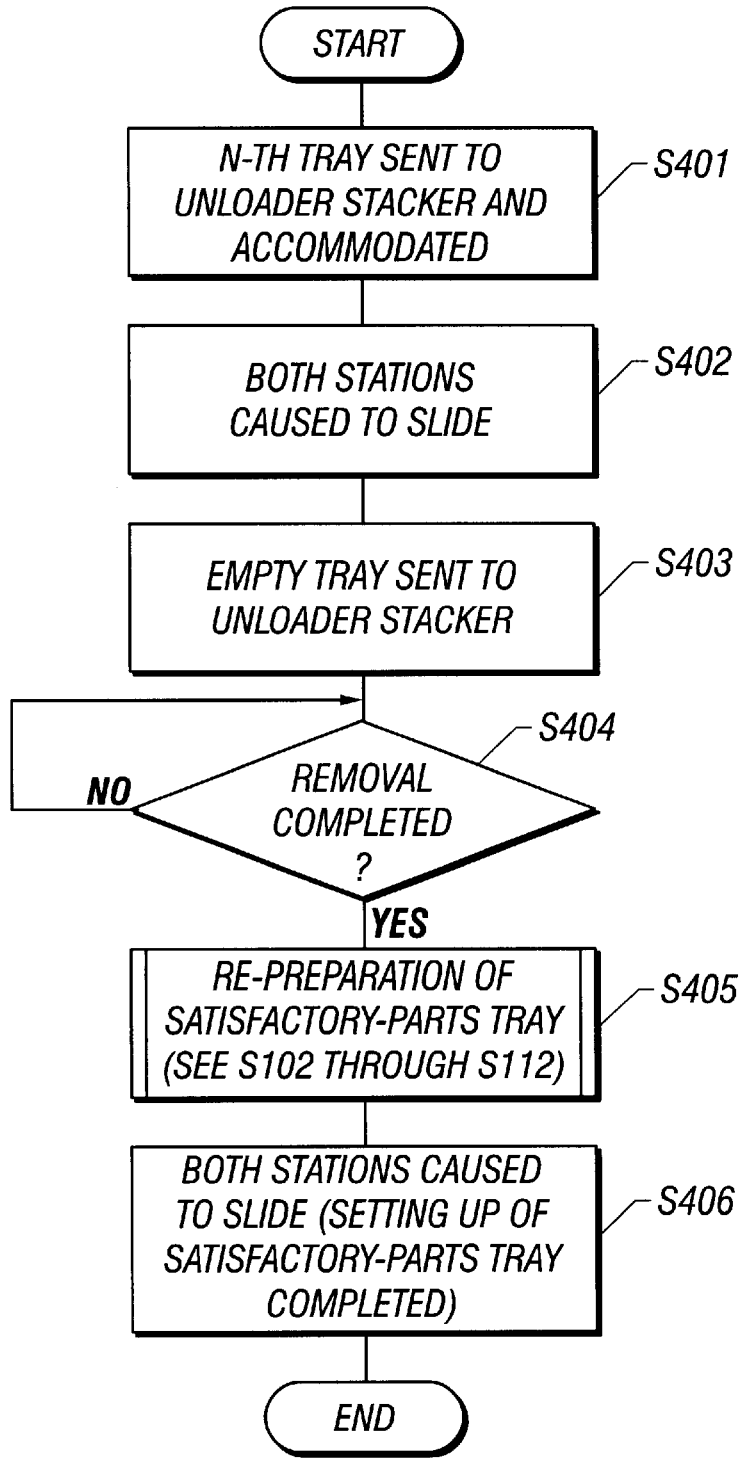
FIG. 12 is a flow chart which illustrates Modification 1 of the re-setting processing.
Figure 13:
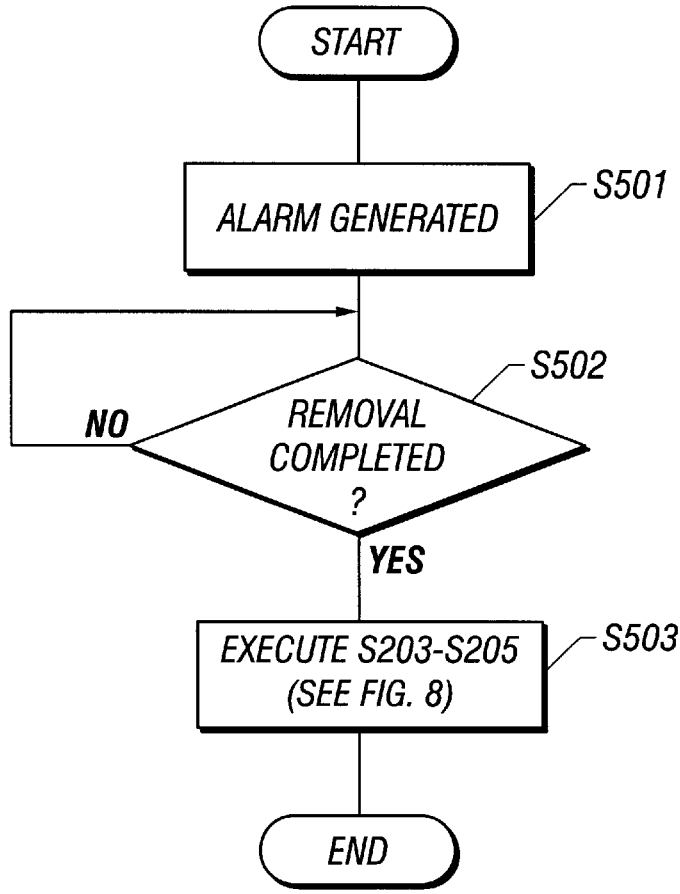
FIG. 13 is a flow chart which illustrates Modification 2 of the re-setting processing.

Incidentally, in regard to this re-setting processing, various modifications may be employed. Modification 1 of the re-setting processing is shown in FIG. 12, and Modification 2 of the re-setting processing is shown in FIG. 13. These modifications will be described later.

In the re-setting processing shown in FIG. 8, a tray that is filled with satisfactory parts is used as the satisfactory-parts tray. However, it is also possible to prepare a satisfactory-parts tray by removing an empty tray from the sub-station 38 at the time that such an empty tray is generated, positioning the sub-station 38 on the conveying line 200, and then utilizing the next tray that is conveyed from the inspection device. In such a case, the same process from S103 to SI 13 in FIG. 4 is performed.

Figure 11:
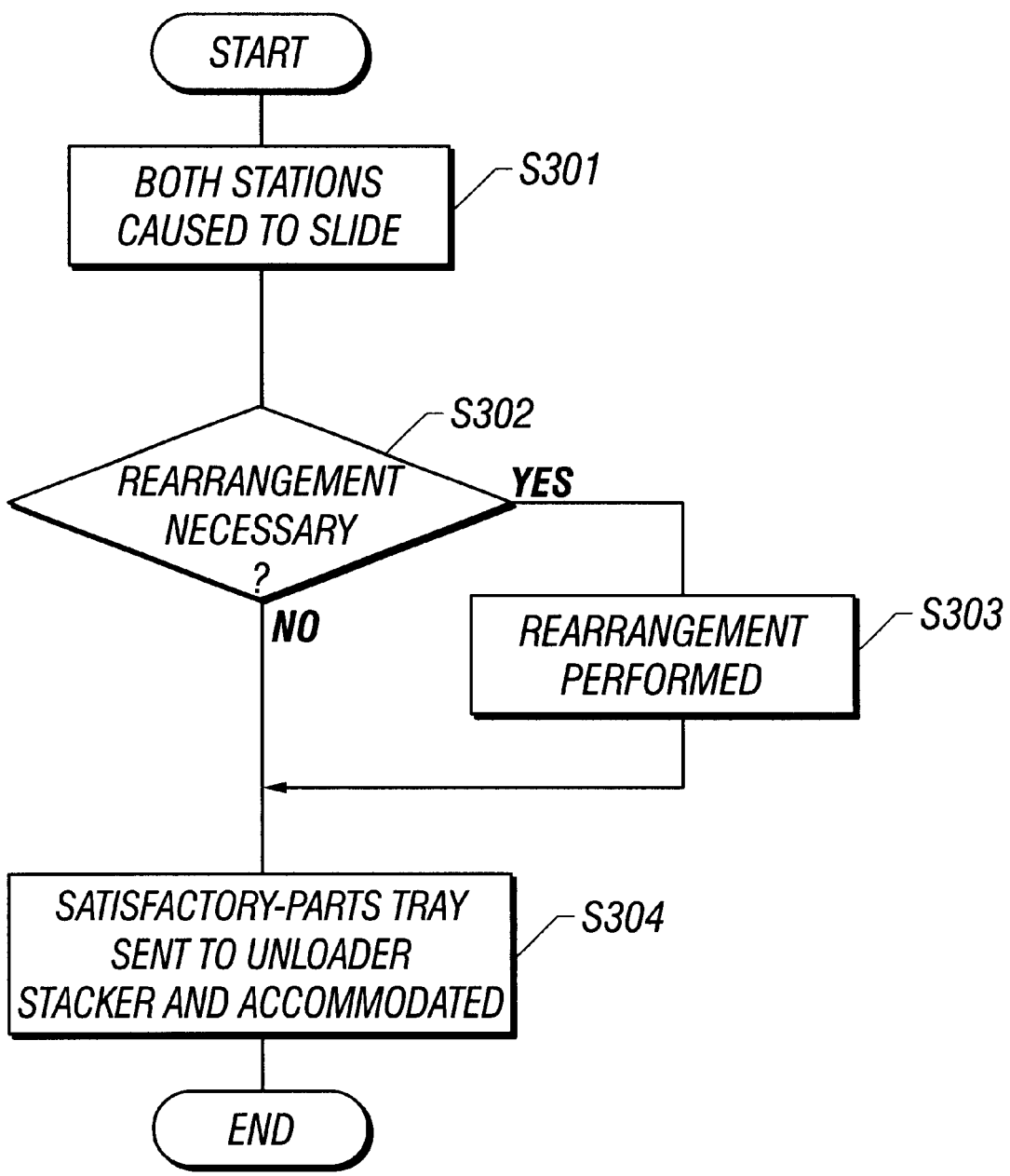
FIG. 11 is a flow chart which illustrates the lot-end processing.

Next, the lot-end processing S132 shown in FIG. 5 will be described with reference to FIG. 11.

In S301, the main station 36 and sub-station 38 are caused to slide by the station sliding mechanism 40, so that the substation 38 is positioned on the conveying line 200.

A judgement is made in S302 as to whether or not rearrangement of the satisfactory parts on the satisfactory-parts tray positioned on the sub-station 38 is necessary. If such a rearrangement is necessary, a rearrangement of parts in which, for example, the satisfactory parts are solidly lined up from one end of the tray is performed in S303.

In S304, the satisfactory-parts tray is sent to the unloader stacker 46 in the same manner as other trays and is stacked by the unloader stacker in the same manner as other trays. Accordingly, the tray that has been used as a satisfactory-parts tray is added to the lowermost stage of a plurality of stages of trays filled with satisfactory parts.

Next, Modification 1 of the re-setting processing will be described with reference to FIG. 12.

In cases where, for instance, no empty tray stacker 48 is installed in view of the structure of the conveying apparatus 32 shown in FIG. 1, it is desirable that the re-setting processing shown in this Modification 1 be performed.

First of all, in S401, the n-th tray is sent from the main station 36 to the unloader stacker 46 and is stacked and accommodated.

In S402, the main station 36 and sub-station 38 are caused to slide; as a result, the sub-station 38 is positioned on the conveying line 200.

In S403, the empty tray positioned on the substation 38 is conveyed to the unloader stacker 46 and is thus temporarily withdrawn to the unloader stacker 46.

In S404, the work of removing the empty tray is completed by the operator in accordance with, for example, an operator call.

When the removal of the empty tray is completed, processing which again prepares a satisfactory-parts tray is performed in S405. In concrete terms, for example, the processes from S103 to S112 shown in FIG. 4 are performed; and a satisfactory-parts tray is prepared using a tray discharged from the inspection apparatus 16.

In S406, the main station 36 and substation 38 perform a sliding movement, so that the main station 36 is positioned on the conveying line 200 this time. As a result, the sub-station 38 is positioned in the above-described adjacent position; and at the same time, the satisfactory-parts tray is also positioned in this adjacent position. In other words, as a result of this operation, the setting up of the satisfactory-parts tray is completed.

In the above-described Modification 1, empty trays can be discharged from the apparatus using the conveying line 200. In the above description, the removal of empty trays is performed manually. However, if a mechanism which discharges empty trays via the unloader stacker 46 is employed, the empty trays are automatically discharged. Furthermore, in Modification 1, the next tray discharged from the inspection apparatus 16 is utilized to prepare the satisfactory-parts tray; however, it is of course possible to feed a processed tray onto the sub-station 38 from the unloader stacker 46.

Next, Modification 2 of the re-setting processing will be described with reference to FIG. 13.

In this Modification 2, the empty tray stacker 48 is not installed, and the empty trays are basically removed by hand. However, the setting up of the satisfactory-parts tray is automated. Thus, a semi-automated system is used.

In S501, the operator is informed by an alarm that an empty tray has been generated. As a result, the empty tray is removed from the sub-station 38 by the operator, for example.

When this removal is confirmed in S502, the processes of S203 through S205 shown in FIG. 8 are performed in S503 wherein the tray, which is with only satisfactory parts thereon and on the main station 36, is placed on the sub-station 38.

As seen from the above, with the re-setting processing shown in FIG. 8, the setting up of the satisfactory-parts tray can be completely automated. Accordingly, the worling characteristics can be improved, and the treatment capacity of the apparatus can be increased. In the Modifications shown in FIGS. 12 and 13 some work by the operator is required for the processing of empty trays. However, since the setting up of the satisfactory-parts tray itself is automated, effort can be saved in this sense.

Incidentally, an alarm is generated when the defective-parts tray on the upper-stage table 62 and the reclaimable-parts tray on the lower-stage table 64 are filled with parts; an then these trays are manually replaced with empty trays. However, since the frequency of generation of defective parts and reclaimable parts is extremely low, the resulting drop in working characteristics is not a major problem.

In the above, the present invention is described with reference to a conveying apparatus in a package external appearance inspection system. However, the present invention can be widely applied in cases where similar processing is required for other semiconductor parts.

As seen from the above, in the present invention, a satisfactory-parts tray can be quickly prepared in a tray conveying apparatus, that the working characteristics and reliability can be improved, and the treatment capacity of the apparatus can be maintained or increased.

What is claimed is:

1. A tray conveying apparatus which has a conveying line that conveys trays on which a plurality of semiconductor parts are carried, said tray conveying apparatus comprising:

a main staton which is disposed in a movable manner at a prescribed position on said conveying line for conveying trays;

a sub-station which is disposed in a movable manner at a position adjacent to said prescribed position on said conveying line, said sub-station for carrying satisfactory-part replenishment trays;

a station exchanging means which exchanges stations positioned at said prescribed position on said conveying line;

a part transfer means which removes deficient parts from a tray that is fed onto and positioned at the main station and replenishes satisfactory parts in said tray from said satisfactory-part replenishment tray when said main station is positioned at said prescribed position on said conveying line; and a control means which controls operation of said tray conveying apparatus, and wherein said control means comprises:

a means for positioning said sub-station at said prescribed position on said conveys line instead of said main station;

a means for preparing, as said satisfactory-part replenishment tray, a tray with only satisfactory parts thereon on said sub-station positioned at said prescribed position on said conveying line; and a means for positioning said main station at said prescribed position on said conveying line instead of said sub-station, and for positioning said sub-station in said adjacent position, after said tray with only satisfactory parts thereon has been prepared.

2. A tray conveying apparatus according to claim 1, wherein said means for preparing a tray with only satisfactory parts thereon comprises:

a means for feeding a tray onto said sub-station and for positioning said tray at the sub-station; and a means for removing all of the deficient parts from the tray at said sub-station.

3. A tray conveying apparatus according to claim 1, wherein said means for preparing a tray with only satisfactory parts thereon comprises a means for returning a tray discharged into a discharge section of said conveying line to said sub-station, and for positioning said tray on said sub-station.

4. A tray conveying apparatus according to claim 1, wherein, said main station and said sub-station are installed parallel to each other; and said station exchanging means includes a station sliding mechanism for moving both of said stations horizontally in a direction perpendicular to said conveying line.

5. A tray conveying apparatus according to claim 4, further comprising:

at least one table which carries a deficient-parts tray; and a table sliding mechanism for positioning said table above the sub-station positioned in said adjacent position.

6. A tray conveying according to claim 1, further comprising an empty tray stacker which, when said satisfactory-part replenishment tray has become an empty tray, receives said empty tray from said sub-station, and accommodates said empty tray.

7. A tray conveying according to claim 1, wherein when said satisfactory-part replenishment tray has become an empty tray, said sub station is positioned in said prescribed position on said conveying line, and said empty tray is discharged using said conveying line.

8. A tray conveying according to claim 1, wherein said part transfer means comprises:

a suction chucking nozzle which holds said parts by vacuum suction; and a nozzle moving mechanism which moves said suction chucking nozzle in three dimensions.

9. A tray conveying method in which trays on which a plurality of semiconductor parts are carried are conveyed over a conveying line, deficient parts are removed from trays positioned at a prescribed position on said conveying line, and satisfactory parts are replenished, said method comprising the steps of:

positioning a sub-station at said prescribed position on said conveying line;

feeding a tray onto and positioning said tray at said sub-station positioned in said prescribed position on said conveying line;

preparing a satisfactory-part replenishment tray by removing all of deficient parts from said tray at said sub-station positioned at said prescribed position on said conveying line; and withdrawing said satisfactory-part replenishment tray at said sub-station from said conveying line, and positioning, instead, a main station which performs tray conveying at said prescribed position on said conveying line.

10. A tray conveying method in which trays on which a plurality of semiconductor parts are carried are conveyed over a conveying line, deficient parts are removed from trays positioned at a prescribed position on said conveying line, and satisfactory parts are replenished, said method comprising the steps of:

positioning a sub-station at said prescribed position on said conveying line;

returning a tray that has been discharged into a discharge section of said conveying line and positioning said tray as a satisfactory-part replenishment tray at said sub-station positioned at said prescribed position on said conveying line; and withdrawing said satisfactory-part replenishment tray from said conveying line, and positioning, instead, a main station which performs tray conveying at said prescribed position on said conveying line.

* * * * *